US010732062B2

(12) United States Patent
Konno et al.

(10) Patent No.: US 10,732,062 B2
(45) Date of Patent: Aug. 4, 2020

(54) SEMICONDUCTOR SENSOR DEVICE AND METHOD FOR MANUFACTURING SAME

(71) Applicant: Hitachi Automotive Systems, Ltd., Hitachinaka-shi, Ibaraki (JP)

(72) Inventors: Takeshi Konno, Hitachinaka (JP); Hiroshi Kikuchi, Hitachinaka (JP); Kentarou Miyajima, Hitachinaka (JP); Munenori Degawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 231 days.

(21) Appl. No.: 15/764,631

(22) PCT Filed: Aug. 3, 2016

(86) PCT No.: PCT/JP2016/072714
§ 371 (c)(1),
(2) Date: Mar. 29, 2018

(87) PCT Pub. No.: WO2017/056698
PCT Pub. Date: Apr. 6, 2017

(65) Prior Publication Data
US 2018/0274999 A1     Sep. 27, 2018

(30) Foreign Application Priority Data
Sep. 30, 2015   (JP) .................... 2015-192520

(51) Int. Cl.
*G01L 19/00*   (2006.01)
*G01L 19/04*   (2006.01)
(Continued)

(52) U.S. Cl.
CPC .......... *G01L 9/0042* (2013.01); *G01L 19/147* (2013.01); *H01L 23/00* (2013.01)

(58) Field of Classification Search
CPC .......... B32B 3/00; B32B 37/06; B32B 37/14; G01L 9/00; G01L 19/00; G01L 19/04;
(Continued)

(56) References Cited

U.S. PATENT DOCUMENTS

| 4,019,388 A | 4/1977 | Hall, II et al. |
| 7,191,658 B2 * | 3/2007 | Oda ........................ G01L 9/006 73/35.03 |

(Continued)

FOREIGN PATENT DOCUMENTS

| DE | 10036284 A1 * | 2/2002 | .......... G01L 9/0051 |
| EP | 0 142 692 A1 | 5/1985 | |

(Continued)

OTHER PUBLICATIONS

International Search Report (PCT/ISA/210) issued in PCT Application No. PCT/JP2016/072714 dated Sep. 27, 2016 with English-language translation (three (3) pages).

(Continued)

*Primary Examiner* — Nguyen Q. Ha
(74) *Attorney, Agent, or Firm* — Crowell & Moring LLP

(57) ABSTRACT

To provide a high-performance semiconductor sensor device and a method for manufacturing the semiconductor sensor device. This semiconductor sensor device has a sensor chip, and a first thin film formed on the sensor chip, said sensor chip being mechanically connected, via the first thin film, to a second thin film formed on a base formed of a polycrystalline material.

10 Claims, 7 Drawing Sheets

(51) Int. Cl.
*H01L 21/58* (2006.01)
*H01L 23/00* (2006.01)
*G01L 9/00* (2006.01)
*G01L 19/14* (2006.01)

(58) Field of Classification Search
CPC ......... G01L 19/14; H01L 21/20; H01L 21/36; H01L 21/52; H01L 21/58; H01L 27/00; H01L 29/66; H01L 29/84
See application file for complete search history.

(56) References Cited

U.S. PATENT DOCUMENTS

| | | |
|---|---|---|
| 2003/0094050 A1 | 5/2003 | Miyazaki et al. |
| 2005/0164043 A1 | 7/2005 | Skrobanek et al. |
| 2010/0219487 A1 | 9/2010 | Donis |
| 2011/0256652 A1* | 10/2011 | Guo ..................... C23C 14/022 438/53 |
| 2012/0273034 A1 | 11/2012 | Sato et al. |

FOREIGN PATENT DOCUMENTS

| | | |
|---|---|---|
| JP | 2003-149068 A | 5/2003 |
| JP | 2005-214971 A | 8/2005 |
| WO | WO 2008/036705 A2 | 3/2008 |
| WO | WO 2008/043612 A2 | 4/2008 |

OTHER PUBLICATIONS

Japanese-language Written Opinion (PCT/ISA/237) issued in PCT Application No. PCT/JP2016/072714 dated Sep. 27, 2016 (three (3) pages).

Extended European search report issued in counterpart European Application No. 16850875.2 dated Sep. 5, 2019 (15 pages).

Partial Supplementary European Search Report issued in counterpart European Application No. 16850875.2 dated May 2, 2019 (14 pages).

* cited by examiner

SEMICONDUCTOR SENSOR DEVICE AND METHOD FOR MANUFACTURING SAME

TECHNICAL FIELD

The present invention relates to a semiconductor sensor device and a method for manufacturing the same.

BACKGROUND ART

As a method for fixing a semiconductor sensor chip on a pedestal or case, PTL 1 describes adhering and fixing a chip set of semiconductor sensor chip and glass table in a concave part of a chip case by a silicon-based adhesive.

CITATION LIST

Patent Literature

PTL 1: Japanese Patent Application Laid-Open No. 2003-149068 Publication

SUMMARY OF INVENTION

Technical Problem

When the semiconductor sensor device is a mechanical/physical sensor for detecting a distortion of a stainless pedestal and operating, a sensor chip and a fixing part of the stainless pedestal transmit the distortion, and thus are preferably made of a material capable of accurately transmitting the distortion of the stainless pedestal. However, when the sensor chip is fixed on the stainless pedestal by use of the silicon-based adhesive, solder, or low-melting-point glass, the fixing material generally has a thickness of several to several tens μm, and thus the fixing material itself serves as a layer for alleviating a distortion between the sensor chip and the stainless pedestal and the distortion of the stainless pedestal cannot be accurately transmitted to the sensor chip.

Further, if the semiconductor sensor device is exposed to high temperature, the fixing material such as adhesive or solder is creep-deformed and alleviates a distortion of the stainless pedestal, which is a cause of a deterioration in property of the semiconductor sensor device.

Further, the sensor chip is generally made of a silicon material, and varies in its property when having thermal stress applied due to a change in temperature when being fixed by solder or low-melting-point glass. Thus, it is preferable to fix the sensor chip to the stainless pedestal at a low temperature close to the use temperature of the semiconductor sensor device in order to reduce a variation in property of the sensor chip. However, when being fixed by the silicon-based adhesive, solder, or low-melting-point glass, the sensor chip experiences a heating/cooling process and certainly has thermal stress applied, which is a cause of a deterioration in property of the sensor chip.

The present invention is directed to provide a high-performance semiconductor sensor device and a method for manufacturing the same.

Solution to Problem

A semiconductor sensor device of the present invention for solving the above described problem includes: a sensor chip; and a first thin film formed on the sensor chip, wherein the sensor chip is mechanically connected to a second thin film formed on a polycrystal pedestal via the first thin film.

Advantageous Effects of Invention

According to the present invention, it is possible to provide a high-performance semiconductor sensor device and a method for manufacturing the same.

DESCRIPTION OF EMBODIMENTS

Figure 1:
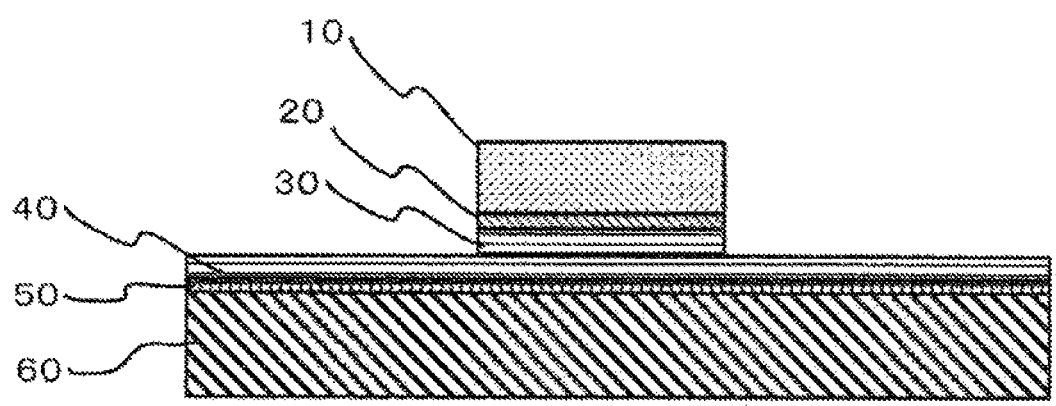
FIG. 1 is a cross-section view illustrating a mounting configuration of a semiconductor sensor device according to a first embodiment of the present invention.

A semiconductor sensor device according to a first embodiment of the present invention will be described below in detail with reference to the drawings. FIG. 1 is a cross-section view illustrating a mounting configuration of the semiconductor sensor device according to one embodiment of the present invention. The semiconductor sensor device according to the present embodiment is configured of a sensor chip 10, a first thin film 20 formed on the sensor chip, a second thin film 30 formed on the sensor chip, a second thin film 40 formed on a stainless pedestal, a first thin film 50 formed on the stainless pedestal, and the stainless pedestal 60. The sensor chip 10 is bonded to the stainless pedestal 60 via the second thin film 30 formed on the sensor chip and the second thin film 40 formed on the stainless pedestal.

The sensor chip 10 is a semiconductor sensor chip having a function of measuring the physical amount, for example. The plane to be bonded of the sensor chip 10 is mirror-polished at line roughness of about Ra<1 nm and at roughness of about Rz<5 nm. After being mirror-polished, the plane is cleansed by isopropyl alcohol, for example. Further, the plane to be bonded of the stainless pedestal 60 is mirror-polished at line roughness of about Ra<1 nm and at roughness of about Rz<5 nm, and cleansed by isopropyl alcohol, for example, after being mirror-polished similarly to the sensor chip 10. Here, the planes to be bonded of the sensor chip 10 and the stainless pedestal 60 are mirror-polished since a bonding force is due to an atomic force when the second thin film 30 formed on the sensor chip is contacted with and bonded to the second thin film 40 formed on the stainless pedestal, which are described below. The atomic force is an attracting force working among all the substances, but the attracting force, which is so large as to keep the materials contacted, does not work if a distance between substances is as long as about 1 μm. However, if a distance between substances almost approaches the atomic distance (less than 1 nm), metal bonding occurs if the substances are a metal, and thus as strong a bonding force as bulk of the metal can be obtained.

Figure 3:
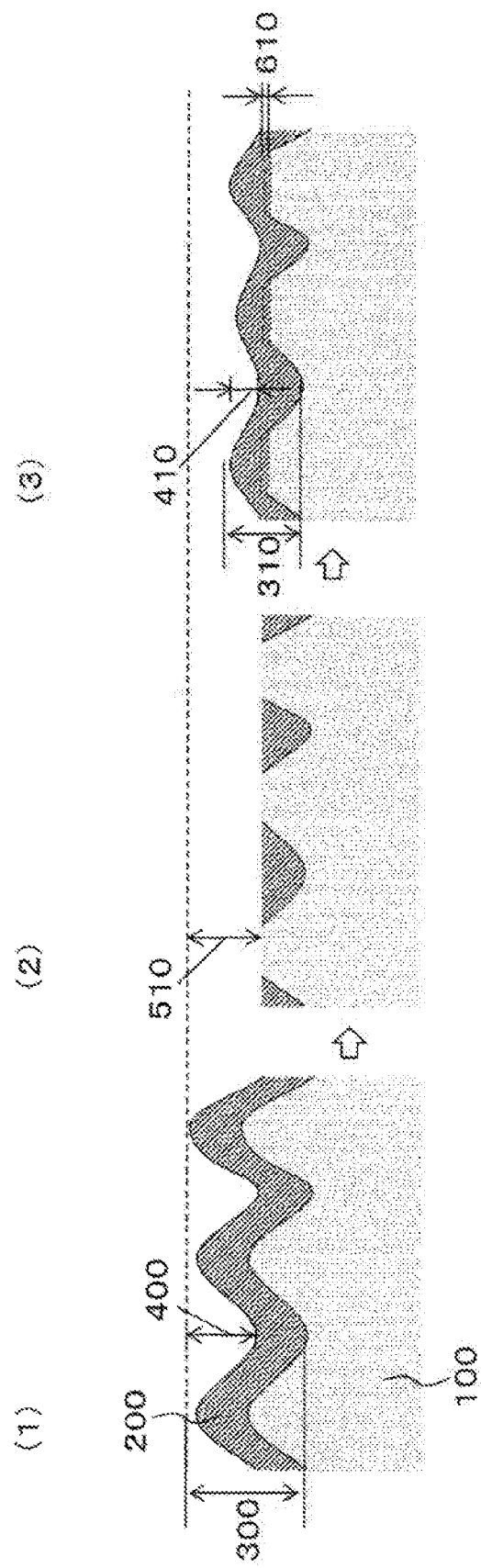
FIG. 3 is a cross-section view of first-stage polishing illustrating a principle of mirror polishing according to the present invention.

The bonding faces need to be mirror-polished in order to make a distance between substances close to the atomic distance (less than about 1 nm) as described above. The mirror polishing according to the present embodiment will be described below with reference to the drawings. FIG. 3 is a cross-section view of first-stage polishing illustrating a principle of the mirror polishing according to the present invention. A base material 100 and a passive film 200 are illustrated in FIG. 3(1). A thickness 300 of the passive film and an unpolished bump 400 are illustrated. Polishing is performed down to a removal thickness 510 (the removal thickness 510 is smaller than the thickness 300 of the passive film). The passive film is regenerated up to a thickness 310 over time as in FIG. 3(3). A thickness 610 of part of the convex part of the base material is consumed when the passive film is regenerated. Further, a bump 410 is obtained and smaller than the unpolished bump 400 at this time. A difference between the unpolished bump 400 and the bump 410 is a roughness reduction effect of the first-stage polishing.

Figure 4:
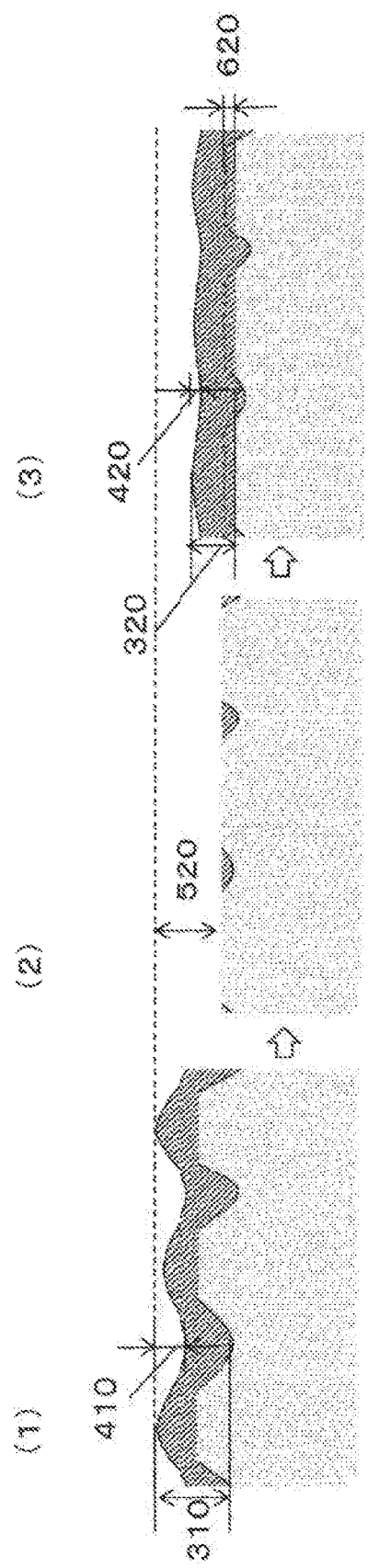
FIG. 4 is a cross-section view of second-stage polishing illustrating the principle of the mirror polishing according to the present invention.

FIG. 4 is a cross-section view of second-stage polishing illustrating the principle of the mirror polishing according to the present embodiment. FIG. 4(1) is similar to FIG. 3(3). In FIG. 4(2), polishing is performed down to a removal thickness 520 (the removal thickness 520 is smaller than the thickness 310 of the passive film). The passive film is regenerated up to a thickness 320 over time as in FIG. 4(3). A thickness 620 of part of the convex part of the base material is consumed when the passive film is regenerated. Further, a bump 420 is obtained and smaller than the bump 410 at this time. A difference between the bump 410 and the bump 420 is a roughness reduction effect of the second-stage polishing.

Figure 5:
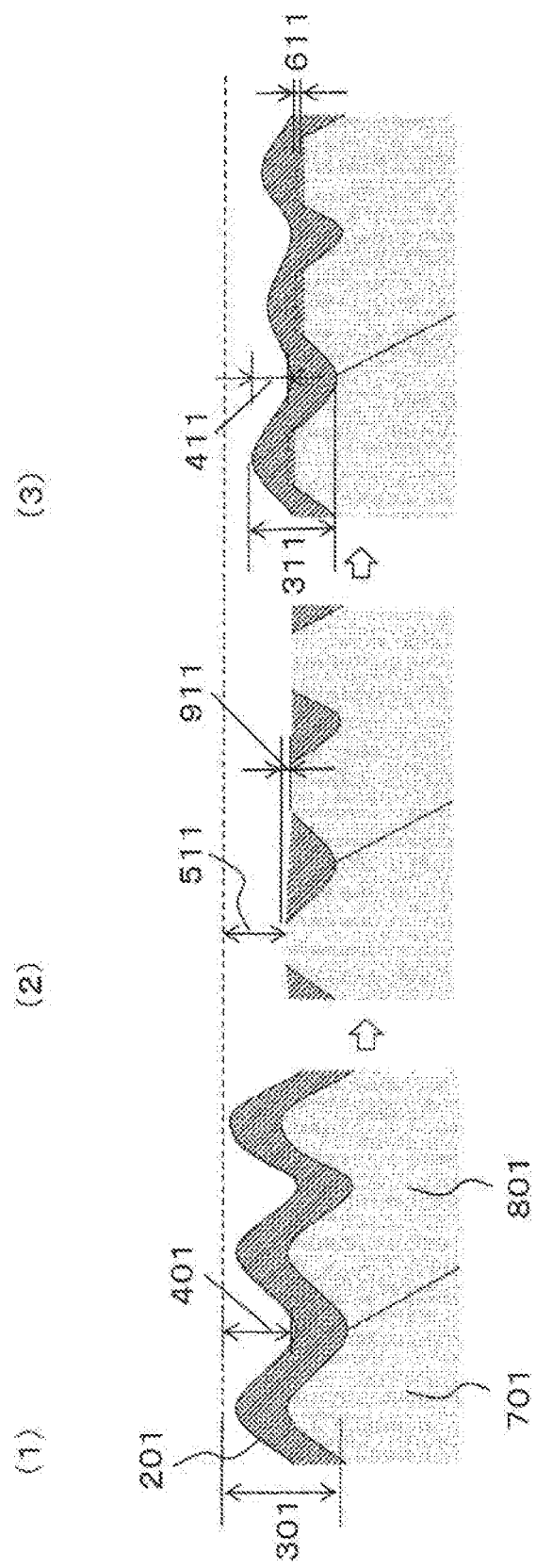
FIG. 5 is a cross-section view of the first-stage polishing illustrating a case in which a polycrystal material is actually polished by the mirror polishing according to the present invention.

FIG. 5 is a cross-section view of the first-stage polishing illustrating a case in which a polycrystal material is actually polished by the mirror polishing according to the present embodiment. Crystal grains 701 and 801 of the base material are illustrated in FIG. 5(1), and are different in crystal orientation. The crystal grain 701 is more difficult to polish than the crystal grain 801, or has a grippy plane orientation. A passive film 201 is illustrated. A thickness 301 of the passive film and an unpolished bump 401 are illustrated. In FIG. 5(2), polishing is performed down to a removal thickness 511 (the removal thickness 511 is smaller than the thickness 301 of the passive film). At this time, the crystal grain 701 is more difficult to polish than the crystal grain 801, and thus a step 911 is caused between the crystal grain 701 and the crystal grain 801. The passive film is regenerated up to a thickness 311 over time as in FIG. 5(3). A thickness 611 of part of the convex part of the base material is consumed when the passive film is regenerated. Further, a bump 411 is obtained and smaller than the unpolished bump 401 at this time. A difference between the unpolished bump 401 and the bump 411 is a roughness reduction effect of the first-stage polishing.

Figure 6:
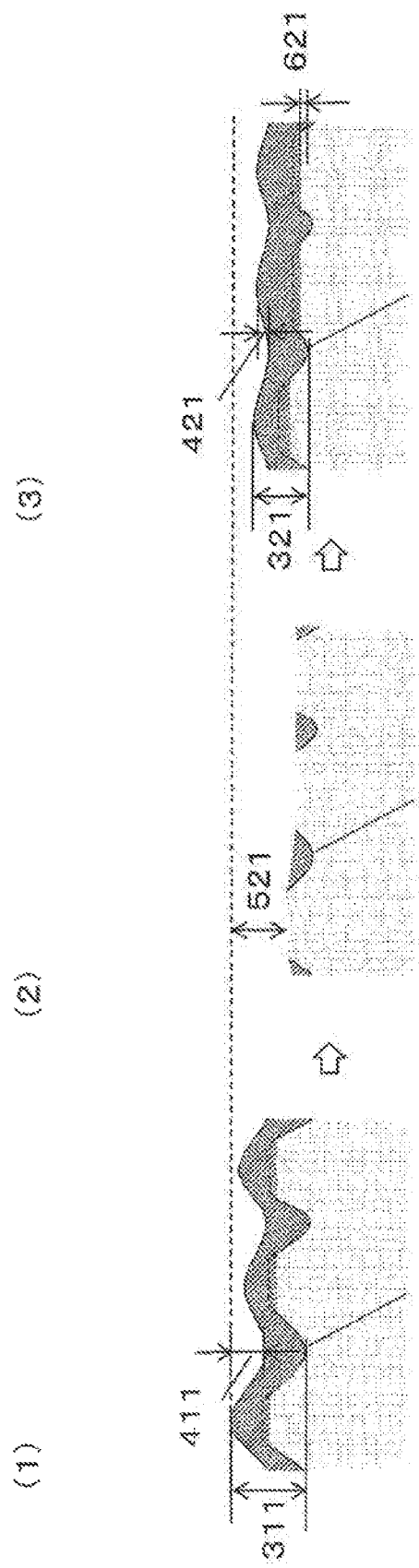
FIG. 6 is a cross-section view of the second-stage polishing illustrating a case in which a polycrystal material is actually polished by the mirror polishing according to the present invention.

FIG. 6 is a cross-section view of second-stage polishing illustrating a case in which a polycrystal material is actually polished by the mirror polishing according to the present embodiment. FIG. 6(1) is similar to FIG. 5(3). In FIG. 6(2), polishing is performed down to a removal thickness 521 (the removal thickness 521 is smaller than the thickness 311 of the passive film). The passive film is regenerated up to a thickness 321 over time as in FIG. 6(3). A thickness 621 of part of the convex part of the base material is consumed when the passive film is regenerated. Further, a bump 421 is obtained and smaller than the bump 411 at this time. A difference between the bump 411 and the bump 421 is a roughness reduction effect of the second-stage polishing.

Figure 7:
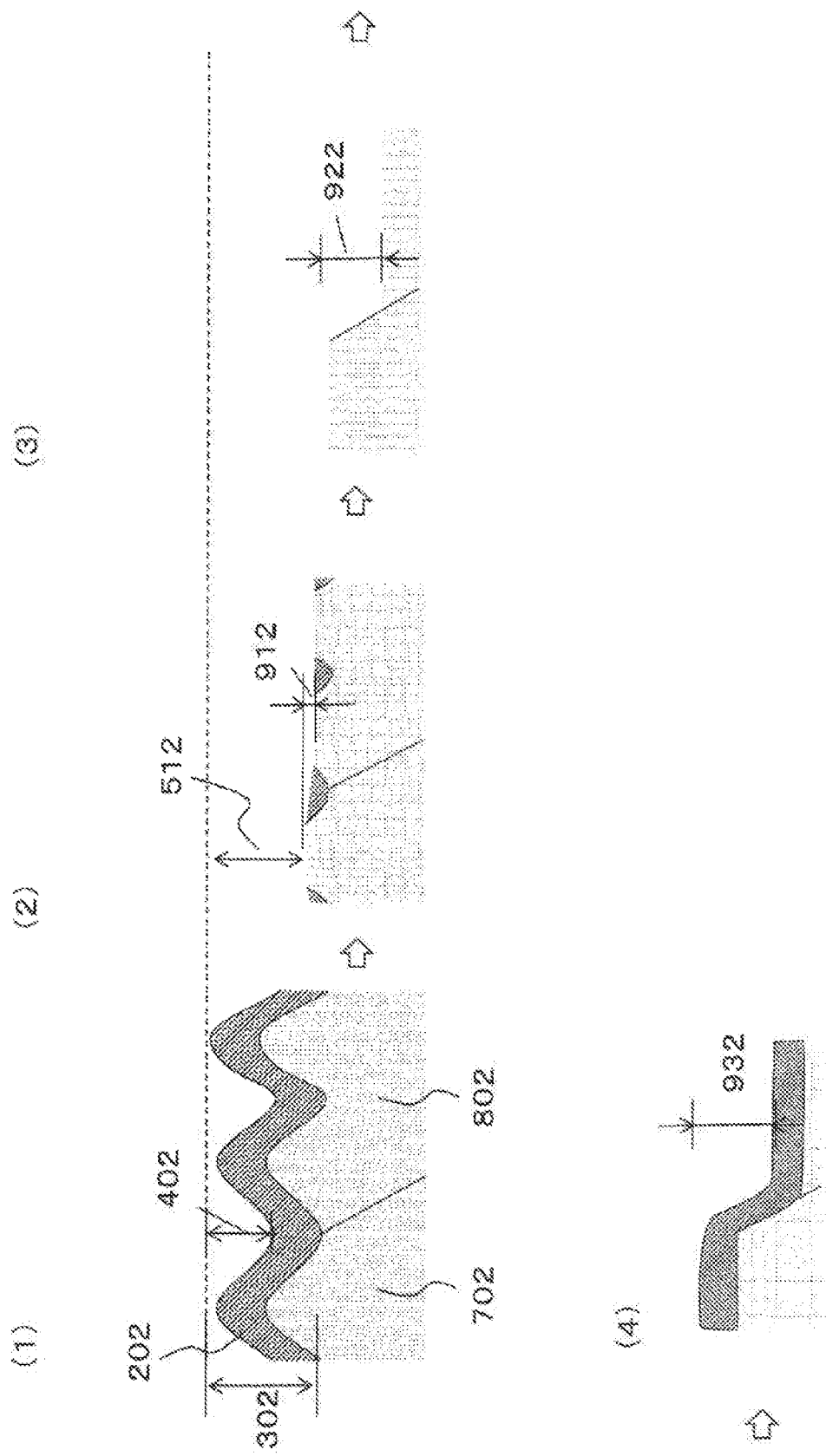
FIG. 7 is a cross-section view illustrating a case in which a polycrystal material is actually polished by mirror polishing not according to the present invention.

FIG. 7 is a cross-section view illustrating a case in which a polycrystal material is actually polished by mirror polishing not according to the present embodiment. Crystal grains 702 and 802 are illustrated in FIG. 7(1), and are different in crystal orientation. The crystal grain 702 is more difficult to polish than the crystal grain 802, or has a grippy crystal orientation. A passive film 202 is illustrated. A thickness 302 of the passive film and an unpolished bump 402 are illustrated. In FIG. 7(2), polishing is performed, down to a removal thickness 512 (the removal thickness 512 is smaller than the thickness 302 of the passive film). At this time, the crystal grain 702 is more difficult to polish than the crystal grain 802, and thus a step 912 is caused between the crystal grain 702 and the crystal grain 802. When polishing is continued beyond the thickness 302 of the passive film, the step between the crystal grain 702 and the crystal grain 802 is larger to be a step 922. The passive film is regenerated over time as in FIG. 7(4), but a step 932 remains left between the crystal grain 701 and the crystal grain 801.

After the mirror polishing, the first thin film 20 formed on the sensor chip 10 is formed on the face to be bonded of the cleansed sensor chip 10 at 0.1 nm to 1 μm by magnetron sputtering, for example, within a vacuum chamber. The first thin film 20 formed on the sensor chip 10 is selected from among W, Al, Cr, Ni, Ti, Ta, Cu, Au, Ft, Fe, Ag, and other elements depending on a material of the stainless pedestal 60. Further, the first thin film 20 may be made of an alloy. The first thin film 50 formed on the stainless pedestal 60 is similarly formed on the face to be bonded of the stainless pedestal 60 at 0.1 nm to 1 μm. The first thin film 50 formed on the stainless pedestal is selected from among W, Al, Cr, Ni, Ti, Ta, Cu, Au, Pt, Fe, Ag, and other elements depending on a material of the stainless pedestal 60. Further, the first thin film 50 may be made of an alloy. The first thin film 20 is formed on the sensor chip 10 and the first thin film 50 is formed on the stainless pedestal since if a difference in crystal system is present between the sensor chip 10 and the second thin film 30 formed on the sensor chip or a difference in lattice constant is large, tightness between the sensor chip 10 and the second thin film 30 formed on the sensor chip is low. The first thin film 20 formed on the sensor chip 10 serves as a buffer film for alleviating a difference in crystal system or a difference in lattice constant between the sensor chip 10 and the second thin film 30 formed on the sensor chip. Similarly, the first thin film 50 formed on the stainless pedestal is formed in order to alleviate a difference in crystal system or a difference in lattice constant between the stainless pedestal 60 and the second thin film 40 formed on the stainless pedestal 60. The thicknesses of the first thin film 20 formed on the sensor chip 10 and the first thin film 50 formed on the stainless pedestal 60 are preferably determined by line roughness of the sensor chip 10. For example, if the line roughness of the sensor chip 10 is at Rz=5 nm, a thickness of 5 nm or more is preferable to fully cover Rz=5 nm. On the other hand, however, if the thickness of the first thin film 20 formed on the sensor chip 10 is excessive, the line roughness increases, and thus the thickness cannot be suitable for bonding described below. Therefore, the appropriate film thicknesses need to be selected.

After the first thin film 20 formed on the sensor chip and the first thin film 50 formed on the stainless pedestal are formed on the sensor chip 10 and the stainless pedestal 60, respectively, the second thin film 30 formed on the sensor chip is formed on the first thin film 20 formed on the sensor chip at 0.1 nm to 1 μm by magnetron sputtering, for example. The second thin film 30 formed on the sensor chip is selected from among Au, Ag, Cu, and other elements, for example. The second thin film 40 formed on the stainless pedestal 60 is similarly formed on the first thin film 50 formed on the stainless pedestal at 0.1 nm to 1 μm also on the face to be bonded of the stainless pedestal 60. The second thin film 40 formed on the stainless pedestal is selected from among Au, Ag, Cu, and other elements, for example. The second thin film 30 formed on the sensor chip and the second thin film 40 formed on the stainless pedestal 60 are preferably made of the same element. The second thin film 30 formed on the sensor chip and the second thin film 40 formed on the stainless pedestal 60 are made of the same element since a difference in crystal system or a difference in lattice constant is not caused and a bonding force is strong in the bonding described below when the bonding interfaces are made of the same element. The thicknesses of the second thin film 30 formed on the sensor chip and the second thin film 40 formed on the stainless pedestal 60 are preferably 0.3 nm or more for about one atomic layer in order to prevent the bonding faces from being oxidized when the bonding described below is performed in atmosphere. Further, a thickness of 50 nm or more is preferably employed in order to secure allowance for foreign materials adhered on the bonding faces. On the other hand, however, the thicknesses of the second thin film 30 formed on the sensor chip and the second thin film 40 formed on the stainless pedestal 60 are excessive, the line roughness increases and thus the thicknesses cannot be suitable for the bonding described below. Thus, the appropriate film thicknesses need to be selected.

After the first thin film 20 formed on the sensor chip and the second thin film 30 formed on the sensor chip are formed on the sensor chip 10 and the first thin film 50 formed on the stainless pedestal and the second thin film 40 formed on the stainless pedestal are formed on the stainless pedestal 60, the second thin film 30 formed on the sensor chip and the second thin film 40 formed on the stainless pedestal are contacted and bonded each other in a vacuum chamber or atmosphere. At this time, an appropriate load is applied for the bonding in consideration of the mirror polishing states of the faces to be bonded of the sensor chip 10 and the stainless pedestal 60. The bonding is preferably performed at a temperature at which the semiconductor sensor device is used in order to reduce thermal stress given to the sensor chip. For example, when the sensor use temperature range is between −50° C. and 150° C., the bonding is preferably performed at about 0 to 100° C.

Figure 2:
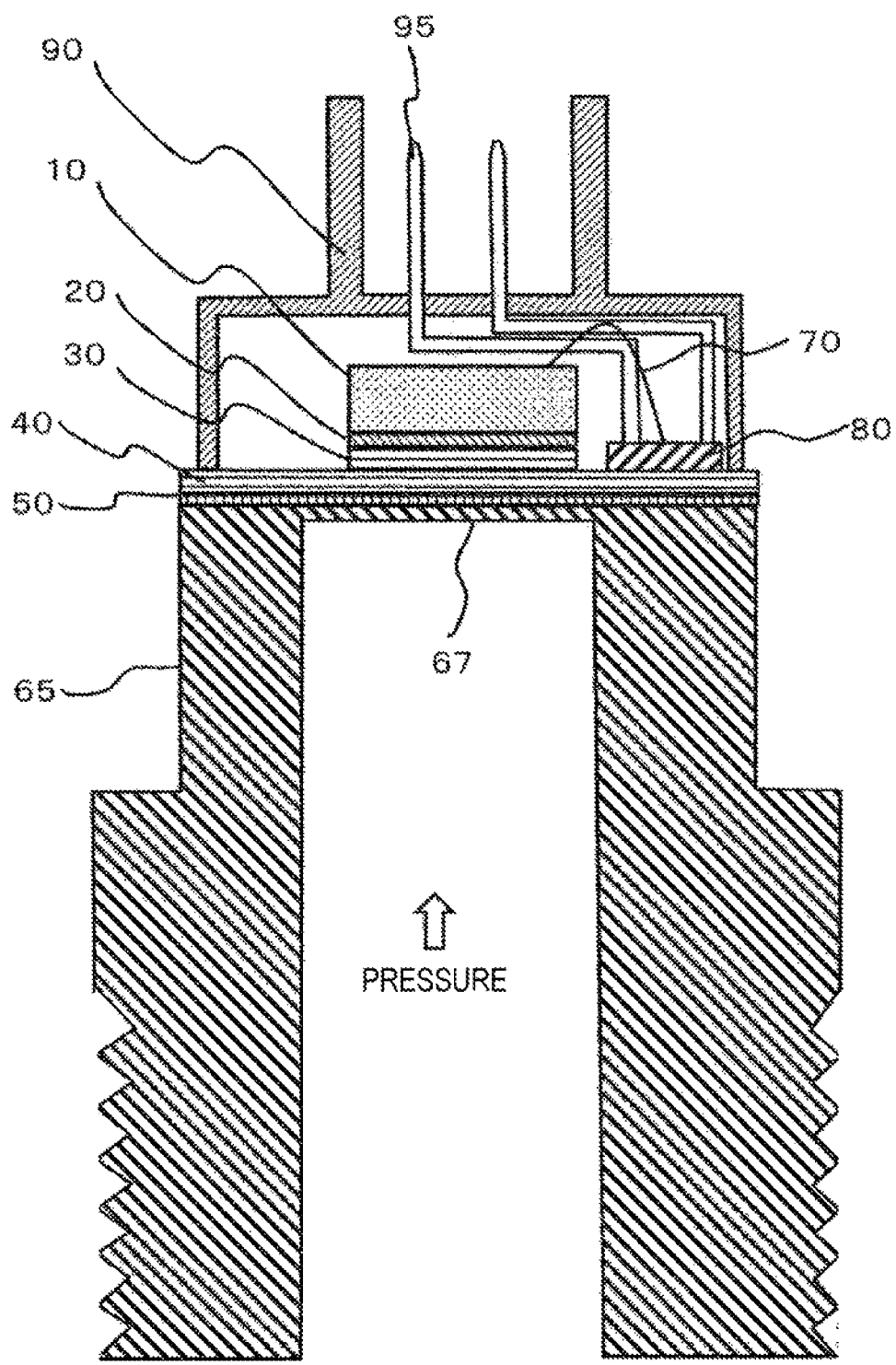
FIG. 2 is a cross-section view illustrating a mounting configuration of a state in which the semi conductor sensor device according to the present invention is used.

A state in which the semiconductor sensor device according to the present embodiment is used will be described below in detail with reference to the drawings. A use state will be described when the semiconductor sensor device according to the present embodiment is used as a sensor for detecting a pressure of a liquid such as automobile fuel or oil. As illustrated in FIG. 2, the semiconductor sensor device according to the present embodiment is configured of the sensor chip 10, the first thin film 20 formed on the sensor chip, the second thin film 30 formed on the sensor chip, the second thin film 40 formed on a stainless pressure receiving pedestal, the second thin film 50 formed on the stainless pressure receiving pedestal, the stainless pressure receiving pedestal 65 with a diaphragm 67, a bonding wire 70, a circuit board 80, a cover 90, and a connector 95. The sensor chip 10 is bonded to the stainless pressure receiving pedestal 65 via the second thin film 30 formed on the sensor chip and the second thin film 40 formed on the stainless pressure receiving pedestal. Further, the sensor chip 10 is electrically connected to the circuit board 80 by use of the bonding wire 70. The circuit board 80 is connected with the connector 95 for conduction to the outside. Further, the sensor chip, the circuit board, and the like are covered with the cover 90 to be protected from the outside air.

The stainless pressure receiving pedestal 65 has the diaphragm 67 thinned by forging or cutting. The procedure in which the sensor chip 10 is bonded to the stainless pressure receiving pedestal 65 is similar to the procedure according to the first embodiment. After the sensor chip 10 is bonded to the stainless pressure receiving pedestal 65, the sensor chip 10 is connected to the circuit board 80 by use of the bonding wire. The stainless pressure receiving pedestal 65 is fixed by a screw at a part where a pressure of a liquid is applied such as a passage of a liquid whose pressure is to be measured. The diaphragm 67 is thin, and thus easily deforms and causes a distortion when a pressure of a liquid changes. The sensor chip 10 connected to the stainless-pressure receiving pedestal 65 via the thin films detects the distortion of the diaphragm 67 of the stainless pressure receiving pedestal 65, thereby detecting a change in pressure. The distortion detected by the sensor chip 10 is converted into an electric signal, and is transmitted to the circuit board 80 via the bonding wire 70. The circuit board 80 is directed for calculating the electric signal from the sensor chip 10.

As described above, according to; the present embodiment, a fixing material with a thickness of several to several tens μm is not provided, and thus a distortion caused in the stainless pedestal can be accurately transmitted to the sensor chip. Thus, a high-performance semiconductor sensor device can be obtained.

Further, a fixing material with a thickness of several to several tens μm is not provided, and thus creep deformation of the fixing material is remarkably small even when the semiconductor sensor device is used at high temperature. Therefore, a distortion of the stainless pedestal is not alleviated, and a high-performance semiconductor sensor device can be obtained.

Further, the sensor chip can be fixed on the stainless pedestal without thermal stress applied thereto, and thus the property of the sensor cannot be deteriorated.

Thus, it is possible to provide a high-performance semiconductor sensor device.

The embodiments of the present invention have been described in detail, but the present invention is not limited to the above embodiments, and can be variously changed in design without departing from the spirit of the present invention described in CLAIMS. For example, the above embodiments are described in detail for explaining the present invention in a comprehensible way, and are not necessarily limited to one comprising all the components described above. Further, part of the configuration of an embodiment may be replaced with the configuration of other embodiment, and the configuration of an embodiment may be added with the configuration of other embodiment. Further, part of the configuration of each embodiment may be added with, deleted, or replaced with other configuration.

REFERENCE SIGNS LIST

10: Sensor chip
20: First thin film formed on sensor chip

30: Second thin film formed on sensor chip
40: second thin film formed on stainless pedestal
50: First thin film formed on stainless pedestal
60: Stainless pedestal
65: Stainless pressure receiving pedestal
67: Diaphragm
70: Bonding wire
80: Circuit board
90: Cover
95: Connector
100: Base material
200: Passive film
201: Actual polycrystal passive film
202: Passive film not according to present invention
300: Thickness of passive film
301: Thickness of actual polycrystal passive film
302: Thickness of passive film not according to present invention
310: Thickness of passive film after polishing 1
311: Thickness of actual polycrystal passive film after polishing 1
320: Thickness of passive film after polishing 2
321: Thickness of actual polycrystal passive film after polishing 2
400: Unpolished bump
401: Actual polycrystal unpolished bump
402: Unpolished bump not according to present invention
410: Bump after polishing 1
411: Actual polycrystal bump after polishing 1
420: Bump after polishing 2
421: Actual polycrystal bump after polishing 2
510: Removal thickness in polishing 1
511: Actual polycrystal removal thickness in polishing 1
512: Removal thickness in polishing 1 not according to present invention
520: Removal thickness in polishing 2
521: Actual polycrystal removal thickness in polishing 2
610: Thickness 1 used for regenerating passive film
611: Thickness 1 used for regenerating actual polycrystal passive film
620: Thickness 2 used for regenerating passive film
621: Thickness 2 used for regenerating actual polycrystal passive film
701: Actual polycrystal grain which is difficult to polish
702: Polycrystal grain which is difficult to polish not according to present invention
802: Polycrystal grain which is easy to polish not according to present invention
801: Actual polycrystal grain which is easy to polish
911: Step 1 per actual polycrystal grain
912: Step 1 per crystal grain not according to present invention
922: Step 2 per crystal grain not according to present invention
932: Step 3 per crystal grain not according to present invention

The invention claimed is:

1. A semiconductor sensor device comprising:
   a first thin film that is disposed on a sensor chip;
   a second thin film that is formed on a pedestal, wherein
      the first thin film and the second thin film are bonded at a normal temperature,
      the pedestal includes a convex region formed by material removed from the pedestal surface within a thickness of an oxide film,
      the oxide film includes an oxidized component contained in a base material of the pedestal, and
      the convex region includes the oxide film being disposed thereon, the oxide film being regenerated on the pedestal surface after the material is removed.

2. The semiconductor sensor device according to claim 1, wherein the pedestal is a stainless pressure receiving pedestal configured to detect a change in pressure.

3. The semiconductor sensor device according to claim 2, wherein the sensor chip is a physical/mechanical sensor.

4. The semiconductor sensor device according to claim 1, wherein the first and second thin films are made of any one or some of W, Al, Cr, Ni, Ti, Ta, Cu, Au, Pt, Fe, and Ag, or an alloy.

5. The semiconductor sensor device according to claim 4, wherein the thicknesses of the first and second thin films are 0.1 nm to 1 µm.

6. The semiconductor sensor device according to claim 1, wherein the sensor chip is electrically connected to a circuit board via a bonding wire.

7. A semiconductor sensor device manufacturing method comprising the steps of:
   forming a first thin film on a sensor chip;
   forming a second thin film on a pedestal to be bonded to the sensor chip; and
   bonding the first thin film and the second thin film, wherein
      the bonding step is bonding at a normal temperature, and
      the bonding step comprises the steps of:
         removing a convex region of the pedestal surface within a thickness of an oxide film generated by oxidizing a component contained in a base material of the pedestal; and
         regenerating the oxide film on the pedestal surface after the removal step.

8. The semiconductor sensor device manufacturing method according to claim 7,
   wherein a removal step of removing a convex region of a surface is performed within a thickness of a film regenerated in the film regenerations step after the film regeneration step.

9. The semiconductor sensor device manufacturing method according to claim 7,
   wherein the film is a passive film or altered layer.

10. The semiconductor sensor device manufacturing method according to claim 7,
   wherein the convex region is removed by use of ion beam.

* * * * *